United States Patent [19]

Crisp et al.

[11] Patent Number: 4,866,676

[45] Date of Patent: Sep. 12, 1989

[54] TESTING ARRANGEMENT FOR A DRAM WITH REDUNDANCY

[75] Inventors: Richard D. Crisp, Austin, Tex.; George P. Hoekstra, Fair Oaks, Calif.; George G. Watkins, Austin, Tex.

[73] Assignee: Motorola, Inc., Schaumburg, Ill.

[21] Appl. No.: 172,514

[22] Filed: Mar. 24, 1988

[51] Int. Cl.⁴ .................. G11C 7/00; G11C 29/00
[52] U.S. Cl. ............................ 365/200; 365/201; 365/51
[58] Field of Search .............. 365/200, 201, 51, 63; 371/10, 21

[56] References Cited

U.S. PATENT DOCUMENTS 4,494,220  1/1985  Dumbri et al. ............... 365/200
4,692,900  9/1987  Ooami et al. ................ 365/201

Primary Examiner—Stuart N. Hecker
Assistant Examiner—Glenn A. Gossage
Attorney, Agent, or Firm—James L. Clingan, Jr.

[57] ABSTRACT

A read/write memory has bit line pairs variously having a first or a second true/complement orientation. Data is selectively coupled to and from the bit line pairs to and from a data line pair via a column decoder. The memory has redundant bit line pairs aligned in the first true/complement arrangement. When a redundant bit line pair is implemented, the logic state of the data is inverted both for reading and for writing if the replaced bit line pair is of the second true/complement orientation. This results in the voltage impressed onto the memory cell for a given logic state is the same for the redundant bit line pair as for the bit line pair that it replaced.

5 Claims, 3 Drawing Sheets

TESTING ARRANGEMENT FOR A DRAM WITH REDUNDANCY

FIELD OF THE INVENTION

The present invention relates to dynamic random access memories (DRAMs), and more particularly, to DRAMs which have redundancy.

BACKGROUND OF THE INVENTION

DRAMs are subjected to qualification testing by some users. One function of the testing is to assess the reliability of the supplier's DRAMs. These tests include techniques which accelerate the occurrence of a failure arising from some defect. One of these tests is the bit stress test. The bit stress test is accomplished by writing a data pattern into the DRAM that results in the same charge polarity being stored in each cell while increasing the supply voltage significantly beyond the normal operating voltage but not so great as to be destructive of a good device. The writing of all of the cells to the same voltage polarity is not quite as straightforward as it might sound. In typical DRAMs, a particular cell is coupled to one bit line but when that cell is accessed, the bit line to which it is coupled is compared to another bit line which is considered its pair. In a folded bit line architecture, the two bit lines which form a pair are adjoining. Each pair of bit lines is comprised of a true bit line and a complementary bit line. The true bit line is considered to be a logic high when it is at the comparatively high voltage and at a logic low when it is at the comparatively low voltage. Just the opposite is true for the complementary bit lines. A comparatively high voltage on a complementary bit line is representative of a logic low, and a relatively low voltage is representative of a logic high.

In order to ensure that all of the cells are written to the same voltage polarity, the cells coupled to true bit lines are written to the opposite logic state of the cells coupled to the complementary bit lines. To perform this test requires knowing which addresses select true bit lines and which select complementary bit lines. This information is included in what is commonly known as the "bit map" of the memory array. The supplier then supplies the user with the bit map which is routinely made available by the supplier. Users who desire to perform the bit stress test can then effectively do so.

There is an additional problem which has not been adequately solved with respect to redundancy. In an array which uses folded bit lines it has been found to be advantageous, for layout density, to have the true complement sequence alternate. The first bit line pair, for example, is arranged true then complement. The next bit line pair is arranged complement then true. This results in each bit line having an adjoining bit line of the same type. Each bit line adjoins two bit lines. One of the adjoining bit lines is its pair and is of the opposite type. The other adjoining bit line is from another pair and is of the same type. Using "C" to designate complementary and "T" to designate true, the sequence of adjoining bit lines is CTTCCTTCCTTC... until the normal array is complete. After the normal array is complete, there are redundant columns comprised of bit line pairs. It is desirable, for optimum efficiency of the redundancy, to be able to substitute any redundant column for any defective column. This creates a problem for being able to both ensure a proper bit stress test and retain optimum use of the column redundancy.

This problem is described with reference to FIG. 1 which is a portion of a DRAM array 10 showing two adjacent bit line pairs 11 and 12 and a redundant bit line pair 13. Bit line pair 11 has a true bit line 14, and a complementary bit line 15. Bit line pair 12 has a complementary bit line 16 adjacent to complementary bit line 15, and a true bit line 17. Bit line pair 13 has a true bit line 18 and a complementary bit line 19. Array 10 includes adjacent word lines 21, 22, 23, and 24 which intersect bit line pairs 11–13 and memory cells 26, 27, 28, 29, 30, 31, 32, 33, 34, 35, 36, and 37 located at intersections thereof. Memory cell 26 has an enable input coupled to word line 22, and an input/output (I/O) coupled to true bit line 14. Memory cell 27 has an enable input coupled to word line 24, and an I/O coupled to true bit line 14. Memory cell 28 has an enable input coupled to word line 21, and an I/O coupled to complementary bit line 15. Memory cell 29 has an enable input couple d to word line 23, and an I/O coupled to complementary bit line 15. Memory cell 30 has an enable input coupled to word line 22, and an I/O coupled to complementary bit line 16. Memory cell 31 has an enable input coupled to word line 24, and an I/O coupled to complementary bit line 16. Memory cell 32 has an enable input coupled word line 21, and an I/O coupled to true bit line 17. Memory cell 33 has an enable input coupled to word line 23, and an I/O coupled to true bit line 17. Memory cell 34 has an enable input coupled to word line 22, and an I/O coupled to true bit line 18. Memory cell 35 has an enable input coupled to word line 24, and an I/O coupled to true bit line 18. Memory cell 36 has an enable input coupled to word line 21, and an I/O coupled to complementary bit line 19. Memory cell 37 has an enable input coupled to work line 24, and an I/O coupled to complementary bit line 19. Array 10 includes a sense amplifier 41 coupled to bit line pair 11, a sense amplifier 42 coupled to bit line pair 12, and a sense amplifier 43 coupled to bit line pair 13. Array 10 has coupling transistors 45, 46, 47, 48, 49, and 50 for coupling bit line pairs 11–13 to a data line pair 51. Data line pair 51 has a true data line 52, and a complementary data line 53. Transistors 45, 48, and 49 selectively couple true data line 52 to true bit lines 14, 17, and 18, respectively. Transistors 46, 47, and 50 selectively couple complementary data line 53 to complementary bit lines 15, 16, and 19, respectively. Any bit line which is selectively coupled to true data line 52 is a true bit line, whereas any bit line which is selectively coupled to complementary data line 53 is a complementary bit line.

To implement redundancy in array 10 using bit line pair 13 to replace either bit line pair 11 or 12 creates a problem with respect to the bit stress test. Replacing bit line pair 11 with bit line pair 13 is not a problem. For example, if word line 22 is enabled, then memory cells 26 and 34, which are both coupled to a true bit line, are enabled. Thus the address which selects replaced true bit line 14 also selects a true bit line in the redundant bit line pair. Similarly, if word line 23 is enabled, memory cells 29 and 37, which are coupled to complementary bit lines, are enabled. Thus, the address which selects replaced complementary bit line 15 selects a complementary bit line in the redundant bit line pair. Thus, bit line pair 13 can replace bit line pair 11 without adversely affecting the bit stress test.

On the other hand, if bit line pair 13 replaces bit lines pair 12, there is a problem. If word line 22 is enabled then memory cells 30 and 34 are enabled. Memory cell 30 is coupled to complementary bit line 16, whereas memory cell 34 is coupled to true bit line 18. Thus for the address which selects cell 30, word line 22 is enabled and would normally result in the I/O of the cell being coupled to complementary data line 53, but with bit line pair 13 replacing bit line pair 12, memory cell 34 is selected so that the I/O of memory cell 34 is coupled to true data line 52. This means that the address which normally has a comparatively high voltage to represent a logic low now has a comparatively low voltage to represent a logic low. This is not a problem for general use, but it is for the bit stress test. Although it is possible to keep records for each device as to the nature of any changes in its bit map resulting from implement any redundant columns, such an approach would be very cumbersome for both the supplier and the user. The approach in the past has been to either constrain the replacement of defective bit line pairs with ones of the same orientation or to simply not provide for a completely effective bit stress test for devices in which redundancy has been implemented.

SUMMARY OF THE INVENTION

An object of the invention is to provide an improved memory with redundancy.

Another object of the present invention is to provide a memory which has redundancy with improved testability.

Yet another object of the invention is to provide a memory with improved redundancy.

These and other objects are achieved in a memory having an array of bit line pairs characterized as having one of a first or a second true/complement orientation. Each bit line pair is further characterized as having an address which selects the particular bit line pair having the address. Data is transferred between the bit pair line selected by the particular address and a data line pair. External input data is driven onto the data line pair in a write mode and external output data is output from the data line pair in the read mode. The memory has a redundant bit line pair, a redundancy circuit, and an input/output circuit. The redundant bit line pair has the first true/complement orientation. The redundancy circuit is for substituting the redundant bit line pair for a defective one of the array of bit line pairs. The input/output circuit is for inverting the external input data driven onto the data line pair in the write mode and inverting the external output data o utput from the data line pair in the read mode if the address is for the defective bit line pair and the defective bit line pair is of the second true/complement orientation.

DESCRIPTION OF THE INVENTION

Figure 1:
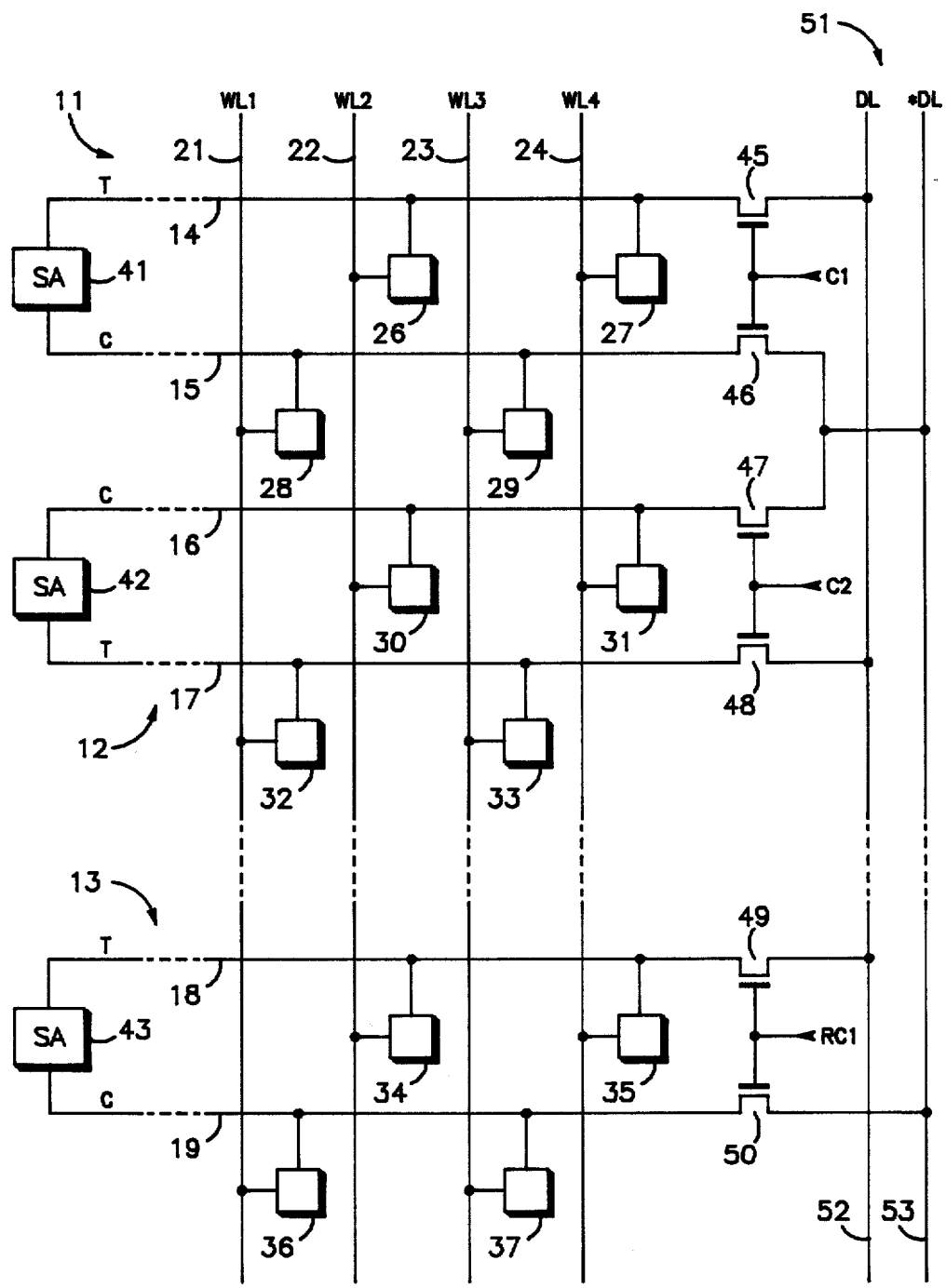
FIG. 1 is a circuit diagram of a portion of a DRAM of the prior art.
Figure 2:
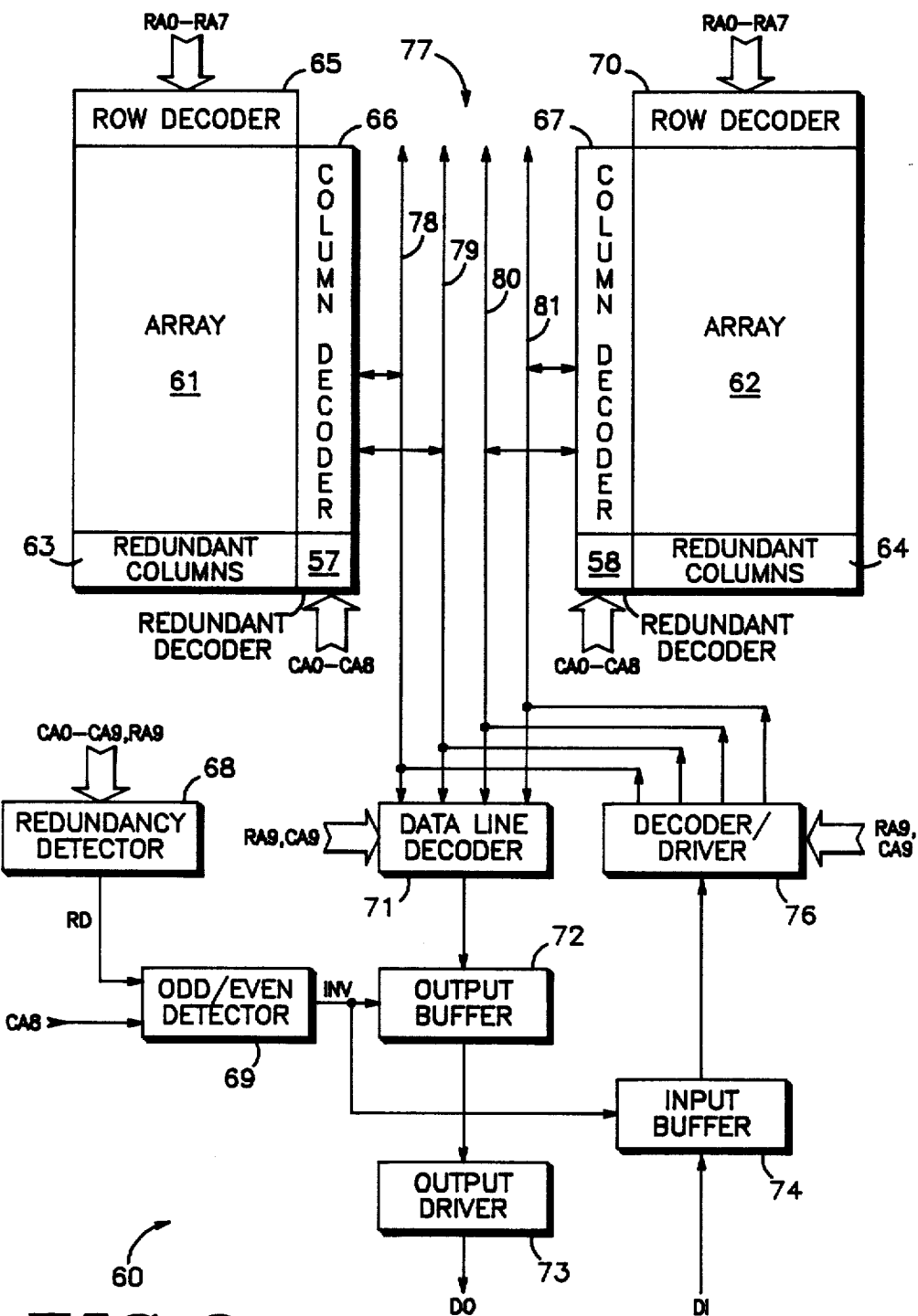
FIG. 2 is a block diagram of a DRAM according to a preferred embodiment of the invention.

Shown in FIG. 2 is a DRAM 60 comprised of a redundant decoder 57, a redundant decoder 58, a normal array 61, a normal array 62, redundant columns 63, redundant columns 64, a column decoder 66, a column decoder 67, a redundancy detector 68, an odd/even detector 69, a data line decoder 71, an output buffer 72, an output driver 73, an input buffer 74, a decoder/driver 76, and data line pairs 77. Normal arrays 61 and 62 are comprised memory cells coupled to word lines, bitlines, and sense amplifiers such as those shown in FIG. 1. Data line pairs 77 comprise data line pairs 78, 79, 80 and 81. In normal operation column decoder 66 selectively couples, from array 61, one pair of bit lines to data line pair 78 and one pair of bit lines to data line pair 79 in response to address signals CA0–CA8. Similarly, column decoder 67 selectively couples, from array 62, one pair of bit lines to data line pair 80 and one pair of bit lines to data line pair 81 in response to address signals CA0–CA8. A particular combination of address signals is the address of a particular bit line pair. Column decoders 66 and 67, as is common for DRAMs with column decoding between arrays, share many devices. If column redundancy is implemented for array 61 then a pair of replacement bit lines from redundant columns 63 is coupled to the data line pair of data line pairs 77 to which the replaced bit line pair would have been coupled in response to the address of the replaced bit line pair. The replacement bit line pair is coupled to the appropriate data line pair of data line pairs 77 via redundant decoder 57. redundant decoder 57, as is conventional for a redundant decoder, is programmable to be responsive to the particular logic combination of address signals which comprise the address of the replaced bit line pair. Also, as is conventional for a decoder for a memory which has redundancy, column decoder 66 is prevented from coupling the replaced bit line pair to a data line pair when the address of the replaced bit line pair is received.

For the read mode, decoder 71 couples the data present on a selected one of data line pairs 77 to buffer 72 in response to address signals RA9 and CA9. Buffer 72 buffers the received data and outputs it to driver 73 which outputs the data as data output signal DO. In the write mode, buffer 74 receives data to be written as data input signal DI. Buffer 74 outputs the data to decoder/driver 75 which selectively drives one of data lines 77 in response to address signals CA9 and RA9. Redundancy detector 68 detects if the receive address is for a bit line pair which has been replaced by a redundant column. If the logic state of address signals CA0-CA9 and RA9 is for a bit line pair that has been replaced, redundancy detector 68 outputs a redundancy detection signal RD at a logic high. It is common for a memory to detect if an address is for a redundant column. Odd/even detector 69 detects if the replacement bit line pair is replacing a bit line pair at an odd or an even address location and outputs an invert signal INV with respect thereto to buffer 72 and buffer 74. The bit line pairs with an even address have the same true/complement orientation as the bit line pairs of the redundant columns. The bit line pairs which are located at odd addresses have the opposite true/complement orientation to that of the bit line pairs of the redundant columns. Address signal CA8 is a logic high for odd addresses and a logic low for even addresses. Signal INV is thus generated at a logic high if signals CA8 and RD are both a logic high.

If the bit line pair which is replaced is at an odd address, the redundant replacement will have its bit lines in the opposite true/complement orientation to that of the replaced bit line pair. Buffer 74 is then directed by signal INV to invert the data so that the data written into the memory location will be of the opposite polarity to what it would normally be written but would then be the same polarity of the location it is replacing. When the location is read, signal INV is again generated to which buffer 72 responds by inverting the data back to the original state originally received as signal DI by buffer 74. Signal DO is then provided as the same logic state for a read as was originally received for storing. The bit map as viewed by the user is thus unchanged. Writing a logic state to an address of a redundant bit line pair which replaces a bit line pair in one of the normal arrays in which the particular logic state is mapped as being a comparatively high voltage will also result in the comparatively high voltage being written into the replacement bit line pair even if the replacement bit line pair is of the opposite true/complement orientation to that of the bit line pair it replaces. Thus the bit stress test can be completely performed even if redundancy has been implemented without losing any flexibility in the use of the redundant columns.

Figure 3:
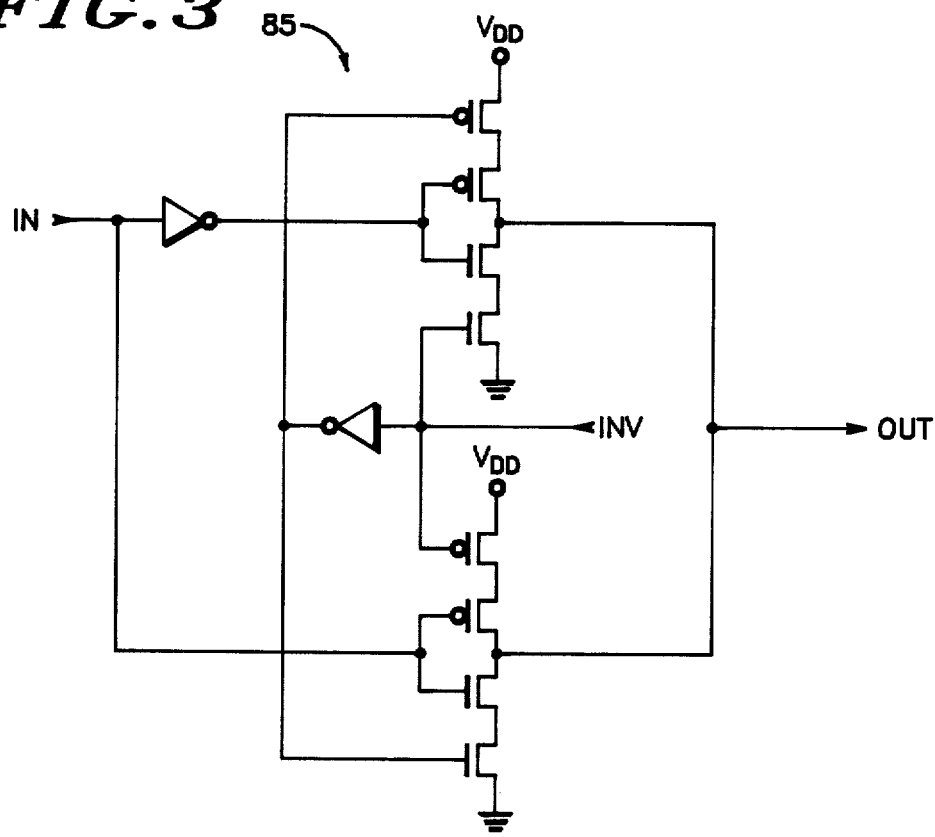
FIG. 3 is a circuit diagram of a first portion of the memory of FIG. 2.

Shown in FIG. 3 is a buffer 85 which is a portion of buffer 74. Buffer 85 performs the logic state inversion for buffer 74 in response to signal INV being a logic high. Buffer 85 provides for selecting one of two paths using clocked inverters. One clocked inverter is enabled while the other is tri-stated. Depending upon which clocked inverter is tri-stated, there is either one or two inversions between the input and the output.

Figure 4:
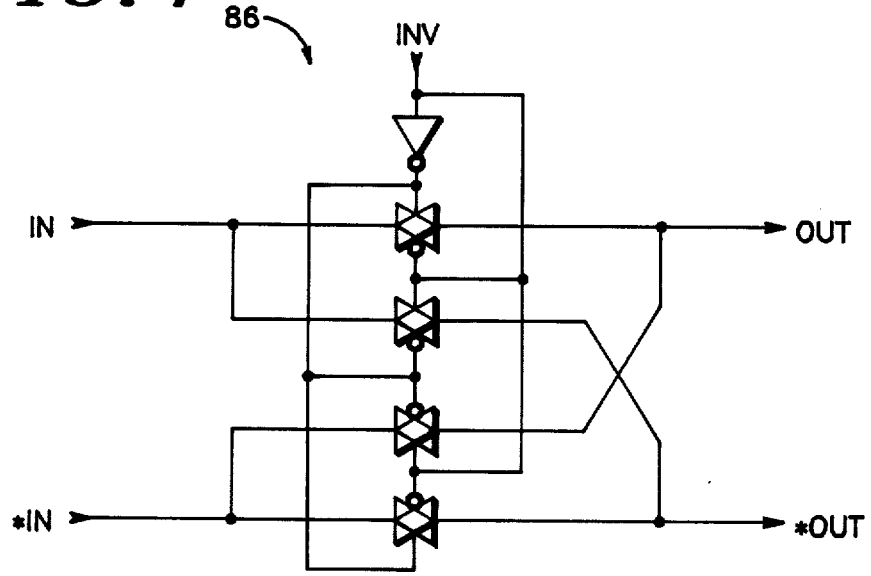
FIG. 4 is a logic diagram of a second portion of the memory of FIG. 2.

Shown in FIG. 4 is a buffer 86 which is portion of buffer 72. Buffer 86 performs the logic state inversion for buffer 72 in response to signal INV. Buffer 86 takes true and complementary inputs and selectively steers them in response to signal INV using transmission gates.

Thus, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

We claim:

1. A memory having a read mode and a write mode, comprising:
  a normal array of memory cells located at intersections of word lines and bit lines, said bit lines arranged in a plurality of bit line pairs each having one of a first and a second true/complement orientation, each bit line pair characterized as having an address and as developing a voltage differential of a polarity representative of one of first and second logic states;
  decoder means for selectively coupling a selected bit line pair from the plurality of bit line pairs to a data line pair in response to a plurality of address signals, a particular combination of address signals being the address of a particular bit line pair, whereby the selected bit line pair and the data line pair to which the selected bit line pair is coupled both have a voltage differential of the same polarity and representative of the same logic state;
  a redundant column having a redundant bit line pair of the first true/complement orientation for replacing a defective bit line pair of the plurality of bit line pairs;
  redundant decoder means for coupling the redundant bit line pair to the data line pair in response to the address of the defective bit line pair;
  detection means for providing an invert signal at the first logic state if the defective bit line pair has a different true/complement orientation than that of the redundant bit line pair and at the second logic state if the defective bit line pair has the same true/complement orientation as that of the redundant bit line pair;
  output means for receiving the invert signal and providing an output signal at the logic state which is the same as that present on the data line pair when the memory is in the read mode and the detection means has provided the inert signal at the second logic state and for providing the output signal at the logic state which is opposite to that present on the data line pair when the memory in the read mode and the detection means has provided the invert signal at the first logic state; and
  input means for providing the voltage differential onto other the data line pair representative of the logic state of an input signal when the memory is in the write mode and the detection means has provided the invert signal at the second logic state and for providing the voltage differential onto the data line pair representative of the logic state opposite to that of the logic state of the input signal when the memory is in the write mode and the detection means has provided the invert signal at the first logic state.

2. The memory of claim 1 wherein the bit line pairs at an odd address are characterized as having the first true/complement orientation and the bit line pairs at an even address are characterized as having the second true/complement orientation.

3. The memory of claim 2, wherein the detection means comprises:
  redundancy detection means for providing a redundancy signal if the plurality of address signals is the address of the defective bit line pair; and
  odd/even detector means, coupled to the redundancy detection means, for providing the invert signal at the first logic state if the redundancy detection means provides the redundancy signal and the address is odd.

4. A DRAM having an array of bit line pairs characterized as having one of a first and a second true/complement orientation, each bit line pair having an address which selects the particular bit line pair having the address wherein data is transferred between the bit line pair selected by the particular address and a data line pair, comprising:
  input/output means, coupled to the data line pair for writing external input data onto the data line pair in a write mode and for providing external output data from the data line pair in the read mode;
  a redundant bit line pair of the first true/complement orientation;
  redundancy means, coupled to the redundant bit line pair, for substituting the redundant bit line pair for a defective one of the bit line pairs;
  input/output control means, coupled to the input/output means, for inverting the external input data written onto the data line pair in the write mode and inverting the external output data provided from the data line pair in the read mode if the address is for the defective bit line pair and the defective bit line pair is of the second true/complement orientation.

5. In a DRAM having an array of bit line pairs characterized as having one of a first and second true/complement orientation, each bit line pair having an address which selects the particular bit line pair having the address wherein data is transferred between the bit line pair selected by the particular address and a data line pair, an input/output circuit for writing external input data onto the data line pair in the read mode, and for providing external output data from the data line pair in the read mode, and a redundant bit line pair of the first true/complement orientation, a method for implementing redundancy, comprising the steps of:

substituting the redundant bit line pair for a defective one of the array of bit line pairs; and inverting the external input data written onto the data line pair in the write mode and inverting the external output data from the data line pair in the read mode if the address is for the defective bit line pair and the defective bit line pair is of the second true/complement orientation.

* * * * *

UNITED STATES PATENT AND TRADEMARK OFFICE
CERTIFICATE OF CORRECTION

PATENT NO. : 4,866,676

DATED : September 12, 1989

INVENTOR(S) : Richard D. Crisp, George P. Hoekstra and George G. Watkins

It is certified that error appears in the above-identified patent and that said Letters Patent is hereby corrected as shown below:

Column 6, line 10, change "inert" to --invert--.

Column 6, line 17, delete "other".

Column 7, line 5, change "read" to --write--.

Signed and Sealed this

Fourteenth Day of August, 1990

Attest:

HARRY F. MANBECK, JR.

*Attesting Officer*   *Commissioner of Patents and Trademarks*